(12) United States Patent
Sonderman et al.

(10) Patent No.: US 6,660,539 B1
(45) Date of Patent: Dec. 9, 2003

(54) METHODS FOR DYNAMICALLY CONTROLLING ETCH ENDPOINT TIME, AND SYSTEM FOR ACCOMPLISHING SAME

(75) Inventors: Thomas J. Sonderman, Austin, TX (US); Alexander J. Pasadyn, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 94 days.

(21) Appl. No.: 10/040,299

(22) Filed: Nov. 7, 2001

(51) Int. Cl.[7] ............................................. H01L 21/66
(52) U.S. Cl. ......................................... 438/14; 438/16
(58) Field of Search ........................... 438/5–14, 16–18, 438/504, 800, 720, 734, 963; 118/663, 675–676, 685; 716/4

(56) References Cited

U.S. PATENT DOCUMENTS

| | | | |
|---|---|---|---|
| 5,372,673 A | * 12/1994 | Stager et al. | 438/8 |
| 5,393,624 A | * 2/1995 | Ushijima | 430/30 |
| 5,780,315 A | * 7/1998 | Chao et al. | 438/8 |
| 6,274,478 B1 | 8/2001 | Farkas et al. | 438/626 |
| 6,479,309 B1 | * 11/2002 | Wright | 438/16 |
| 6,545,753 B2 | * 4/2003 | Subramanian et al. | 356/237.5 |

* cited by examiner

Primary Examiner—David Nelms
Assistant Examiner—David Vu
(74) Attorney, Agent, or Firm—Williams, Morgan & Amerson, P.C.

(57) ABSTRACT

A method comprising performing an etch process recipe comprised of an endpoint etch process and a timed over-etch process on each of a first plurality of substrates to form at least one opening in each layer of insulating material, determining a duration of the endpoint etch process performed on the first plurality of substrates, determining a duration of the timed over-etch process of the etch process recipe to be performed on a second plurality of substrates based upon the determined duration of the endpoint etch process performed on the first plurality of substrates, and performing the etch process recipe comprised of the endpoint etch process and the timed over-etch process of the determined duration on the second plurality of semiconducting substrates. A system comprised of an etch tool for forming at least one opening in a layer of insulating material formed above each of a first plurality of semiconducting substrates by performing an etch recipe comprised of an endpoint etch process and a timed over-etch process on each of the substrates, and a controller that determines a duration of the endpoint etch process performed on the first plurality of substrates and determines a duration of the timed over-etch process of the etch recipe to be performed on a second plurality of semiconducting substrates based upon the determined duration of the endpoint etch process performed on the first plurality of substrates.

19 Claims, 3 Drawing Sheets

METHODS FOR DYNAMICALLY CONTROLLING ETCH ENDPOINT TIME, AND SYSTEM FOR ACCOMPLISHING SAME

BACKGROUND OF THE INVENTION

1. Field of the Invention

The present invention is generally directed to the field of manufacturing semiconductor devices, and, more particularly, to methods for dynamically controlling etch endpoint time, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, FIG. 1 depicts an illustrative semiconductor device, i.e., a transistor 10, that is formed above a semiconducting substrate 12. The transistor 10 is comprised of a gate insulation layer 14, a gate electrode 16, sidewall spacers 18, and doped source/drain regions 20. The transistor 10 is electrically isolated from other similar devices formed above the substrate 12 by the trench isolation region 22. The various structures and components of the transistor 10, as well as the manner in which they are made, are well-known to those skilled in the art and will not be described in any greater detail herein. In a typical integrated circuit device, millions of transistors, such as the transistor 10 shown in FIG. 1, are formed above a semiconducting substrate, thereby resulting in a very densely-packed structure. A typical integrated circuit device includes multiple layers of conductive interconnections, i.e., conductive lines 15 and conductive contacts or vias 17, formed in multiple layers of insulating material 13, e.g., silicon dioxide, etc. The multiple layers of conductive interconnections are the means by which electrical signals propagate throughout the integrated circuit device, thereby allowing the various semiconductor devices, or groups of devices, to perform their intended functions.

The conductive interconnections may be formed from a variety of materials, e.g., aluminum, copper, etc. Recently, copper has become more popular as the choice for these conductive interconnections in high performance integrated circuits due to its lower electrical resistivity as compared to other potential materials, e.g., aluminum. All other things being equal, the lower resistivity of copper interconnections allows an integrated circuit device to operate at faster speeds.

Typically, conductive interconnections comprised of copper are formed in accordance with the following process flow. First, a layer of insulating material, e.g., silicon dioxide, an oxide, an oxynitride, or a material having a dielectric constant less than 5, is formed by a deposition process. Next, openings are formed in the insulating layer using known photo-lithography and etching steps. Thereafter, a thin barrier metal layer, e.g., tantalum, is conformally deposited above the insulating layer and in the openings in the insulating layer. Then, a relatively thin copper seed layer is conformally deposited above the barrier metal layer. A bulk copper layer is then formed across the surface of the insulating layer, and in the openings formed therein, using known electroplating techniques. Lastly, one or more chemical mechanical polishing operations are reformed to remove the excess copper material above the surface of the layer of insulating material.

The process of forming the openings in the layer of insulating material typically involves a two-step etching process, an endpoint etch process followed by a timed, over-etch process. Ideally, the endpoint etch process removes all, or substantially all, of the insulating material within the opening in the layer of insulating material. The endpoint etch process is typically endpointed using an optical technique, e.g., optical spectroscopy, wherein the outgases of the process are optically analyzed to detect for the presence of the underlying copper interconnect, e.g., line, over which the opening is formed. In theory, the optical endpoint detection system indicates when all, or substantially all, of the insulating material is removed from the opening thereby exposing the underlying conductive interconnection. In practice, it is recognized that this initial endpoint process may not completely remove or clear the insulating material from all of the openings in the layer of insulating material. Accordingly, a timed over-etch process is performed, typically for a duration ranging from approximately 15–60 seconds, in an attempt to insure that the openings are all completely clear of the insulating material.

However, the effectiveness of the above-described etching protocol varies across the wafer lots. Such variations may exist for a variety of reasons, e.g., thickness variations in the layer of insulating material, underlying topographical differences, equipment cleanliness, quality of supply gases, etc. Moreover, such across-lot variations in clearing the openings in the layer of insulating material may adversely impact device performance. In some integrated circuit devices, after the devise is substantially complete, it is subjected to an electrical test, a so-called "via chain resistance test," to determine the overall resistance of the integrated circuit device. The lower this overall resistance, the faster the integrated circuit device will perform. Thus, failure to clear openings in the layer of insulating material, which tends to decrease the area of the opening, tends to increase the resistance of the resulting conductive interconnection, and this increased resistance may be cumulative from the perspective of the overall integrated circuit device.

The present invention is directed to an integrated circuit device that may solve, or at least reduce, some or all of the aforementioned problems.

SUMMARY OF THE INVENTION

The present invention is generally direct to methods for dynamically controlling etch endpoint time, and a system for accomplishing sane. In one illustrative embodiment, the method comprises providing a first plurality of semiconducting substrates, each of the substrates having a layer of insulating material formed thereabove, and performing an etch process recipe comprised of an endpoint etch process and a timed over-etch process on each of the first plurality of substrates to form at least one opening in each layer of insulating material. The method further comprises determining a duration of the endpoint etch process performed on the first plurality of substrates, determining a duration of the timed over-etch process of the etch process recipe to be performed on a second plurality of substrates based upon the determined duration of the endpoint etch process performed on the first plurality of substrates, and performing the etch process recipe comprised of the endpoint etch process and the timed over-etch process of the determined duration on the second plurality of semiconducting substrates.

In one illustrative embodiment, the system comprises an etch tool for forming at least one opening in a layer of insulating material formed above each of a first plurality of semiconducting substrates by performing an etch recipe comprised of an endpoint etch process and a timed over-etch process on each of the substrates, and a controller that determines a duration of the endpoint etch process performed on the first plurality of substrates and determines a duration of the timed over-etch process of the etch recipe to be performed on a second plurality of semiconducting substrates based upon the determined duration of the endpoint etch process performed on the first plurality of substrates.

BRIEF DESCRIPTION OF THE DRAWINGS

The invention may be understood by reference to the following description taken in conjunction with the accompanying drawings, in which like reference numerals identify like elements, and in which.

Figure 1:
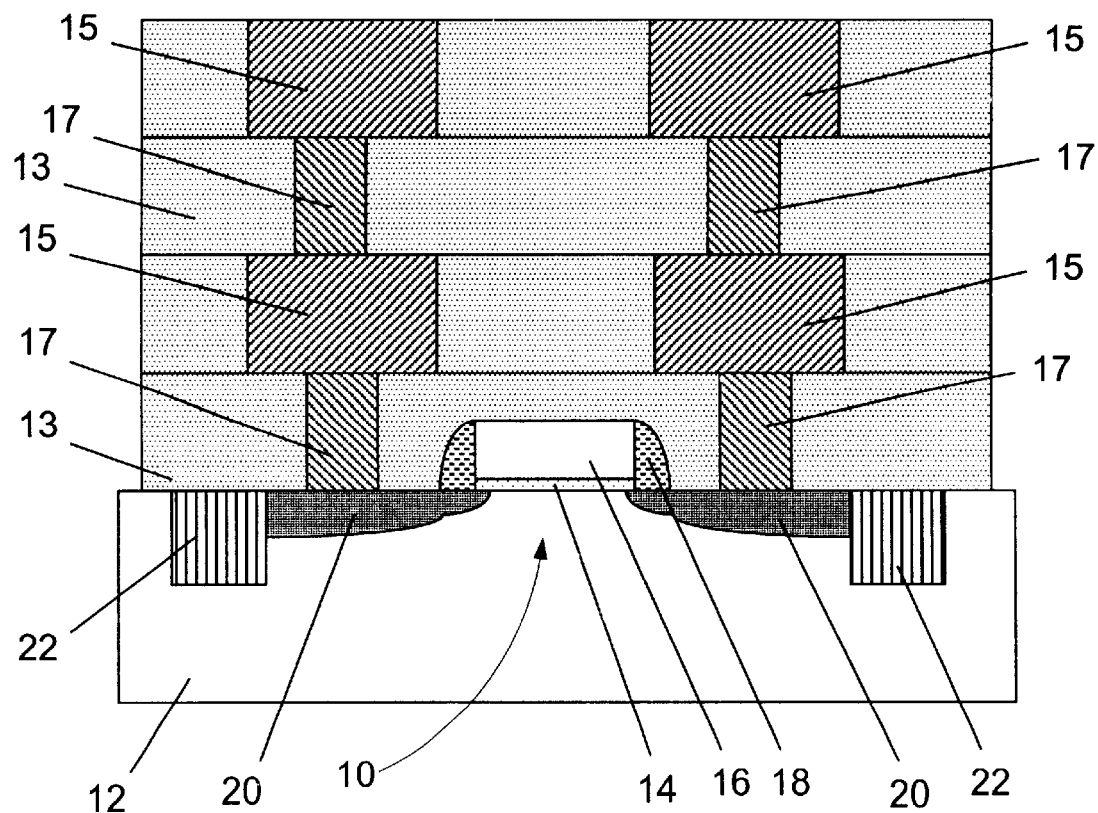
FIG. 1 is a depiction of a prior art transistor having a plurality of conductive interconnections formed thereabove.

While the invention is susceptible to various modifications and alternative forms, specific embodiments the of have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and strictures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to methods for dynamically controlling etch endpoint time, and a system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
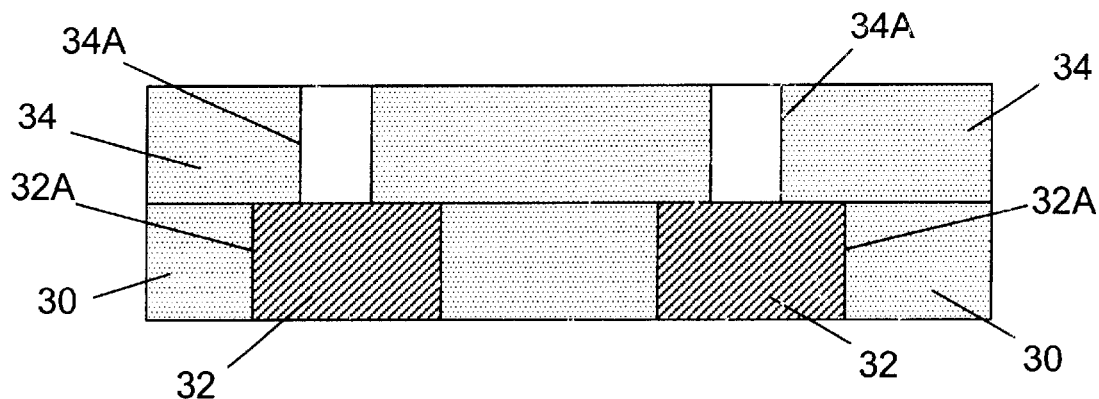
FIG. 2 is a cross-sectional view of a portion of an integrated circuit device having an illustrative insulation layer formed above a previously formed layer of insulating material having conductive interconnections formed therein.

FIG. 2 depicts a portion of a partially-formed integrated circuit device comprised of a first insulating layer 30, a plurality of conductive lines 32, and a second insulating layer 34. The first insulating layer 30 may be comprised of a variety of materials, e.g., an oxide, an oxynitride, silicon dioxide, silicon oxynitride, HSQ, or other materials having a dielectric constant less than 5, and it may be formed by a variety of techniques, e.g., chemical vapor deposition ("CVD"), low pressure chemical vapor deposition ("LPCVD"), etc. Moreover, the first insulating layer 30 may be formed to a variety of thicknesses. In one illustrative embodiment, the first layer of insulating material 30 is comprised of silicon dioxide, and it is formed by a CVD process to a thickness of approximately 0.4–0.6 $\mu$m.

Similarly, the conductive lines 32 may be comprised of a variety of materials, e.g., copper. The conductive lines 32 may be formed by forming openings 32A in the first layer of insulating material 30, and performing the additional steps recited in the background section of this application, e.g., forming a barrier metal layer, forming a copper seed layer, electro-plating bulk copper and polishing. Thereafter, the second insulating layer 34 may be formed above the first insulating layer 30 and the conductive lines 32. The second insulating layer 34 may be formed of similar materials to that described above with respect to the insulating layer 30. In one illustrative embodiment, the second insulating layer 34 is comprised of a layer of silicon dioxide having a thickness ranging from approximately 0.4–0.6 $\mu$m that is formed by a CVD process.

Next, as shown in FIG. 2, the second insulating layer 34 is patterned to define a plurality of openings 34A. As will be recognized by those skilled in the art upon a complete reading of the present application, conductive contacts, i.e., conductive plugs (not shown in FIG. 2), will be formed in the openings 34A. In forming the openings 34A in the second layer of insulating material 34, an initial endpoint etch process is performed followed by a timed over-etch process in an attempt to insure that all, or substantially all, of the insulating material is removed from the openings 34A, i.e., to insure that the openings 34A are substantially cleared of insulating material. The endpoint etch process may be endpointed by using an optical spectroscopy type technique, or by other endpoint techniques known to those skilled in the art.

According to one illustrative embodiment of the present invention, the duration of the over-etch process performed on a second plurality, e.g., lot, of wafers is determined based upon the duration of the endpoint etch process preferred on a first plurality of wafers so as to minimize across-lot variations. The duration of the over-etch process performed on the second plurality of wafers may be expressed as a percentage of the initial endpoint etch process, e.g., a 3% over-etch of a nominal 2 minute endpoint process equals a 3.6 second over-etch process. Simply stated, the present invention involves dynamically updating the over-etch duration (or percentage) based upon endpoint duration data for one or more previously processed groups or lots of wafers to reduce across-lot variations and/or achieve a target chain resistance across multiple wafer lots. The endpoint duration data may be an average value or it may be a value obtained by measuring a subset or representative number of the first plurality of substrates. Other statistically valid sampling methods may also be employed.

In a further embodiment of the present invention, the duration of the endpoint etch process and/or the over-etch process are correlated with the results of electrical chain resistance tests performed after the integrated circuit device is completed. That is, based upon the measured chain resistance values, the duration of the over-etch process performed on a second group of wafers may also be varied to achieve a desired target chain resistance.

Figure 3:
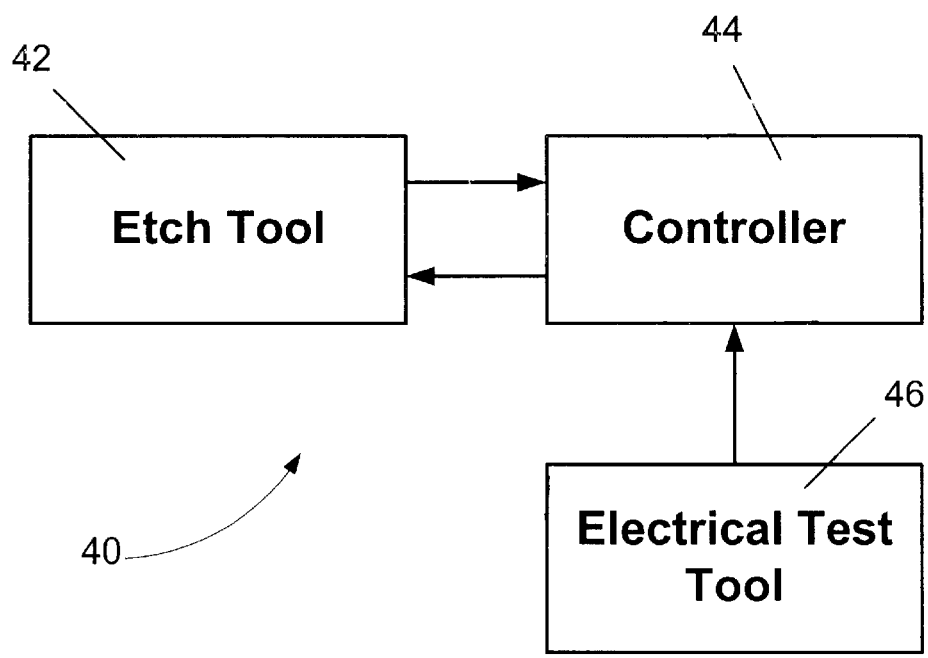
FIG. 3 is a block diagram view of one illustrative embodiment of a system that may be employed with the present invention.

FIG. 3 depicts an illustrative embodiment of a system 40 that may be employed with the present invention. As shown therein, the system 40 is comprised of an etch tool 42, a controller 44 and, in some embodiments, an electrical test tool 46. The controller 44 provides or updates an etch process recipe used to form the openings 34A in the second insulating layer 34 formed on a first plurality of wafers or semiconducting substrates. The duration of the endpoint etch process used in forming the openings 34A is then measured or determined by the controller 44 for one or more wafers within a lot. Based upon this input, the controller 44 determines if the endpoint etch duration for the measured lot is within acceptable preselected limits. If it is not, the controller 44 modifies or updates the etch recipe to vary the duration of the over-etch process to be performed on one or more additional wafer lots based upon this input. Then, in one embodiment, the etch recipe, with the newly determined duration of the timed over-etch process, is then performed in forming openings in a layer of insulating material formed above each wafer in at least one subsequently processed group or wafer lot. In a further embodiment, the controller 44 is provided with the results of via chain resistance tests performed by the electrical test tool 46 on one or more wafers in a first group or lot of wafers. Based upon this input, the controller 46 may then correlate the duration of the over-etch process to be performed oil a second plurality of wafers with the target chain resistance.

In the illustrated embodiments, the controller 44 is a computer programmed with software to implement the functions described herein. Moreover, the functions described for the controller 44 may be performed by one or more controllers spread through the system. For example, the controller 44 may be a fab level controller that is used to control processing operations throughout all or a portion of a semiconductor manufacturing facility. Alternatively, the controller 44 may be a lower level computer that controls only portions or cells of the manufacturing facility. Moreover, the controller 44 may be a stand-alone device, or it may reside on the etch tool 42 or elsewhere within the system. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions are representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 44, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-099-Provisional Specification for CIM Framework Advanced Process Control Component) specifications are publicly available from SEMI.

Figure 4:
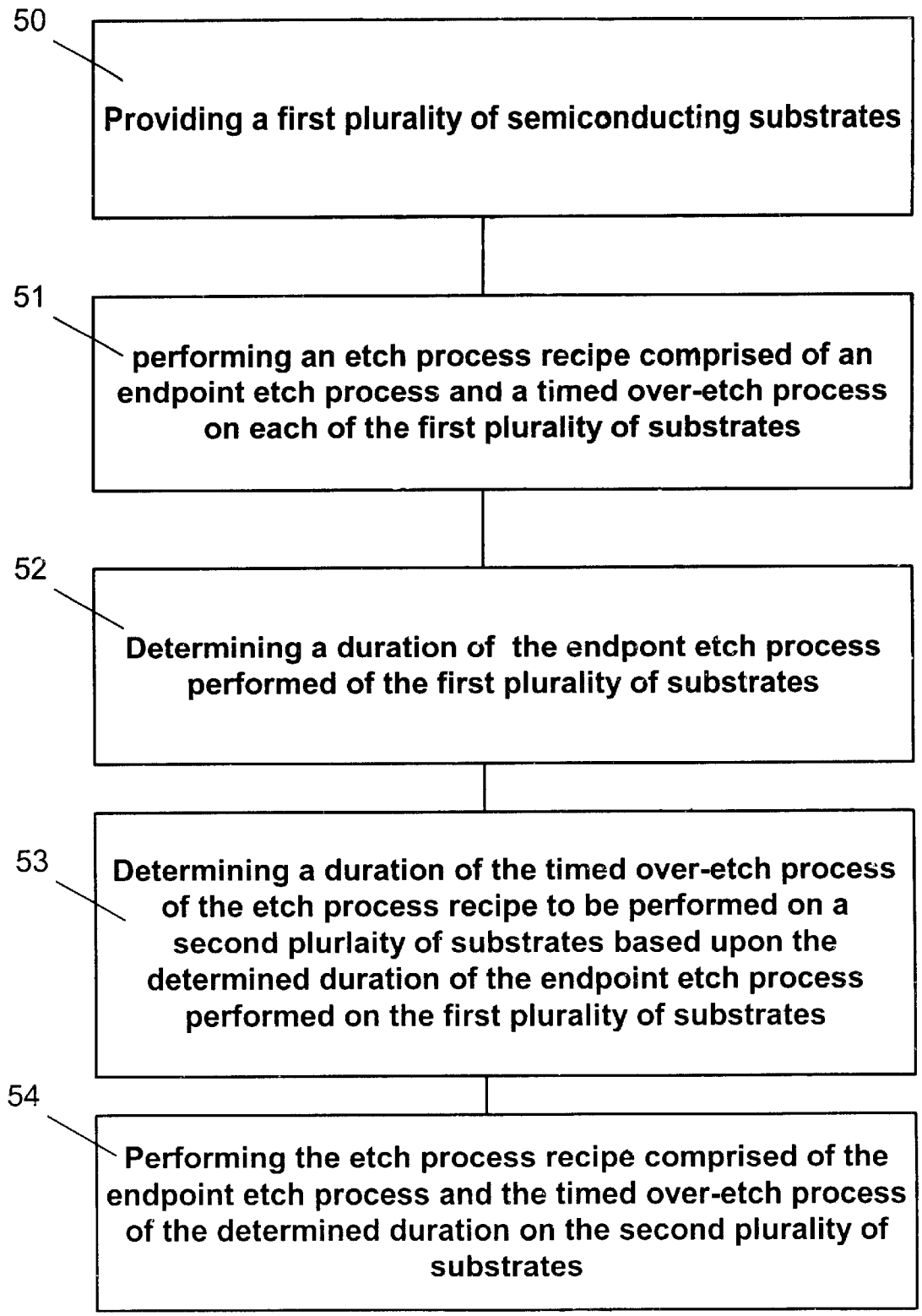
FIG. 4 is a flowchart depicting an illustrative embodiment of a method of the present invention.

The present invention, as indicated in flowchart form in FIG. 4, is generally direct to methods for dynamically controlling etch endpoint time, and a system for accomplishing same. In one illustrative embodiment, the method comprises providing a first plurality of semiconducting substrates, each of the substrates having a layer of insulating material formed thereabove, as indicated at block 50, and performing an etch process recipe comprised of an endpoint etch process and a timed over-etch process on each of the first plurality of substrates to form at least one opening in each layer of insulating material, as set forth in block 51. The method further comprises determining a duration of the endpoint etch process performed on the first plurality of substrates, as recited at block 52, determining a duration of the timed over-etch process of the etch process recipe to be performed on a second plurality of semiconducting substrates based upon the determined duration of the endpoint etch process performed on the first plurality of substrates, as indicated in block 53, and performing the etch process recipe comprised of the endpoint etch process and the timed over-etch process of the determined duration on the second plurality of semiconducting substrates.

In one illustrative embodiment, the system comprises an etch tool for forming at least one opening in a layer of insulating material formed above each of a first plurality of semiconducting substrates by performing an etch recipe comprised of an endpoint etch process and a timed over-etch process on each of the substrates, and a controller that determines a duration of the endpoint etch process performed on the first plurality of substrates and determines a duration of the timed over-etch process of the etch recipe to be performed on a second plurality of semiconducting substrates based upon the determined duration of the endpoint etch process performed on the first plurality of substrates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a first plurality of semiconducting substrates, each of said substrates having a layer of insulating material formed thereabove;
   performing an etch process recipe comprised of an endpoint etch process and a timed over-etch process on each of said first plurality of substrates to form at least one opening in each layer of insulating material;
   determining a duration of said endpoint etch process performed on said first plurality of substrates;
   determining a duration of said timed over-etch process of said etch process recipe to be performed on a second plurality of semiconducting substrates based upon said determined duration of said endpoint etch process performed on said first plurality of substrates; and
   performing said etch process recipe comprised of said endpoint etch process and said timed over-etch process of said determined duration on said second plurality of semiconducting substrates.

2. The method of claim 1, wherein providing a first plurality of semiconducting substrates comprises providing a first plurality of semiconducting substrates comprised of silicon.

3. The method of claim 1, wherein providing a first plurality of semiconducting substrates, each of said substrates having a layer of insulating material formed thereabove comprises providing a first plurality of semiconducting substrates, each of said substrates having a layer of insulating material comprised of at least one of an oxide, an oxynitride, silicon dioxide, and a material having a dielectric constant less than five formed thereabove.

4. The method of claim 1, wherein said endpoint etch process is endpointed through use of optical spectroscopic analysis.

5. The method of claim 1, wherein said at least one opening in said layer of insulating material is adapted to have at least one of a conductive line and a conductive plug formed therein.

6. The method of claim 1, further comprising forming a conductive interconnection comprised of copper in said at least one opening.

7. The method of claim 1, further comprising varying a duration of said over-etch process to be performed on said second plurality of substrates based upon resistance measurements of at least one integrated circuit device formed above at least one of said first plurality of substrates.

8. The method of claim 1, wherein said first plurality of semiconducting substrates is comprised of a first lot of semiconducting wafers.

9. The method of claim 1, wherein said second plurality of semiconducting substrates is comprised of a second lot of semiconducting wafers.

10. The method of claim 1, wherein said determined duration of said endpoint etch process for said first plurality of semiconducting substrates is an average value for the endpoint process performed on said first plurality of substrates.

11. The method of claim 1, wherein said determined duration of said endpoint etch process for said first plurality of semiconducting substrates is a value obtained by measuring a subset of said first plurality of substrates.

12. A method, comprising:
    providing a first lot of semiconducting wafers, each of said substrates having a layer of insulating material comprised of at least one of an oxide, an oxynitride, silicon dioxide, and a material having a dielectric constant less than five formed thereabove;
    performing an etch process recipe comprised of an endpoint etch process and a timed over-etch process on each of said first lot of substrates to form at least one opening in each layer of insulating material;
    determining a duration of said endpoint etch process performed on said first lot of substrates;
    determining a duration of said timed over-etch process of said etch process recipe to be performed on a second lot of semiconducting wafers based upon said determined duration of said endpoint etch process performed on said first lot of wafers; and
    performing said etch process recipe comprised of said endpoint etch process and said timed over-etch process of said determined duration on said second lot of wafers.

13. The method of claim 12, wherein providing a first plurality of semiconducting wafers comprises providing a first plurality of semiconducting wafers comprised of silicon.

14. The method of claim 12, wherein said endpoint etch process is endpointed through use of optical spectroscopic analysis.

15. The method of claim 12, wherein said at least one opening in said layer of insulating material is adapted to have at least one of a conductive line and a conductive plug formed therein.

16. The method of claim 12, further comprising forming a conductive interconnection comprised of copper in said at least one opening.

17. The method of claim 12, further comprising varying a duration of said over-etch process to be performed on said second lot of wafers based upon resistance measurements of at least one integrated circuit device formed above at least one of said first lot of wafers.

18. The method of claim 12, wherein said determined duration of said endpoint etch process for said first lot of wafers is an average value for the endpoint process performed on said first lot of wafers.

19. The method of claim 12, wherein said determined duration of said endpoint etch process for said first lot of wafers is a value obtained by measuring a subset of said first lot of wafers.

* * * * *